United States Patent [19]

Ono et al.

[11] 4,280,131

[45] Jul. 21, 1981

[54] PLEOCHROIC LIGHT EMITTING DIODE AND METHOD OF FABRICATING THE SAME

[75] Inventors: Yuichi Ono; Kazuhiro Ito, both of Tokyo; Mitsuhiro Mori; Masaaki Aoki, both of Kokubunji; Kazuhiro Kurata, Hachioji, all of Japan

[73] Assignee: Hitachi, Ltd., Tokyo, Japan

[21] Appl. No.: 18,330

[22] Filed: Mar. 7, 1979

[30] Foreign Application Priority Data

Mar. 17, 1978 [JP] Japan ................................ 53-29958

[51] Int. Cl.³ .......................................... H01L 33/00
[52] U.S. Cl. ...................................... 357/17; 357/18; 357/55
[58] Field of Search ............................ 357/17, 18, 55

[56] References Cited

U.S. PATENT DOCUMENTS 4,148,045  4/1979  Fang et al. .............................. 357/17

Primary Examiner—Martin H. Edlow
Attorney, Agent, or Firm—Craig and Antonelli

[57] ABSTRACT

A planar-type pleochroic light emitting diode and a method of fabricating the same are disclosed, the diode allowing from a single chip a plurality of light emissions having different center wavelengths. Impurity diffusion is carried out by use of a film having a masking effect to an impurity and a different film partially non-uniform in thickness having no masking effect to the impurity to form a plurality of diffusion regions having different depths. The diode has excellent coupling with an optical fiber, can be easily fabricated and is suitable for use in optical multiplex communication.

7 Claims, 12 Drawing Figures

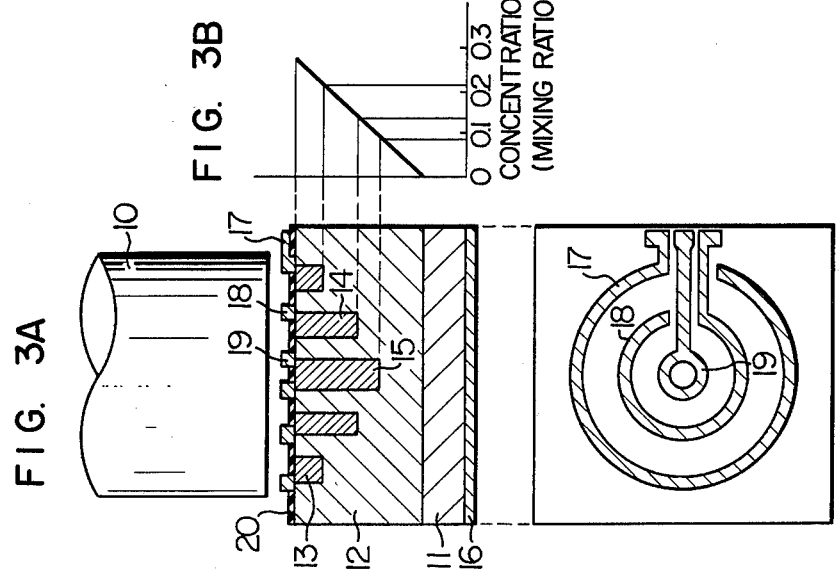
FIG. 3A
FIG. 3B
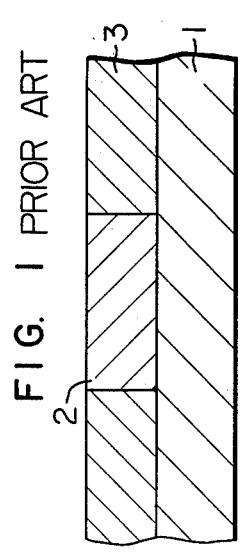
FIG. 1 PRIOR ART
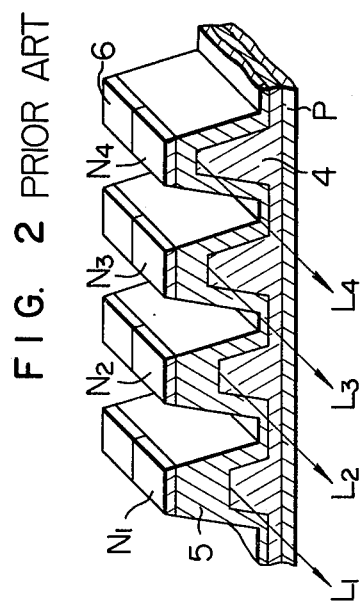
FIG. 2 PRIOR ART

PLEOCHROIC LIGHT EMITTING DIODE AND METHOD OF FABRICATING THE SAME

BACKGROUND OF THE INVENTION

1. Field of the Invention

The present invention relates to a light emitting diode and a method of fabricating the same, and more particularly to a planar-type pleochroic light emitting diode allowing from a single chip a plurality of light emissions having different wavelengths.

2. Description of the Prior Art

As well known, a light emitting diode is far smaller in size than a gas laser or a solid laser, and thus is very suitable for a light source in optical communication. Accordingly, optical communication employing the light emitting diode as the light source has been actively studied.

In information transmission utilizing light as a medium, an optical multiplex transmission system has been proposed in order to increase the amount of information transmitted. In the system, a plurality of light emissions having different wavelengths and a plurality of light-guiding optical fibers are employed in one-to-one correspondence. Alternatively, the different-wavelength light emissions are introduced into and transmitted through a single optical fiber. If such a system is realized, optical communication with a very large information capacity is made possible in addition to the reduction in size of equipment and an increase in transmission rate. The latter technique requires the use of a diode as a light source which allows from a single chip a plurality of light emissions having different wavelengths. Such a diode is termed a pleochroic light emitting diode.

Most conventional light emitting diodes emit monochromatic light. A pleochroic light emitting diode having its structure as shown in FIG. 1 of the accompanying drawings has been proposed in Japanese Patent Publication No. 28869/70. The proposed diode comprises an n-type GaP substrate 1, a first p-type GaP region 2 formed by the diffusion of zinc from the substrate surface, and a second p-type GaP region 3 formed by the diffusion of zinc and oxygen from the substrate surface. Red and green lights are emitted from the first and second p-type regions 2 and 3 respectively. In this diode, however, only a small number of colors are available since different-wavelength light emissions are generated due to the diffusion of different kinds of impurities. Further, it is very difficult to diffuse the different impurities into their desired fine regions respectively. Therefore, this diode has not yet been widely used as a pleochroic light emitting diode.

Japanese Patent Application Laid-Open No. 99991/76 has proposed another pleochroic light emitting diode as shown in FIG. 2 of the accompanying drawings, in which a voltage is applied between an electrode P and each of rectangular-shaped electrodes $N_1$, $N_2$, $N_3$, $N_4$ and so on, and light emissions having different wavelengths are respectively taken out in the directions indicated by arrows $L_1$, $L_2$, $L_3$, $L_4$ and so on. However, since the proposed diode has a mesa structure and emits the lights from its side face, it encounters various problems that the process of fabricating the diode is complicated, that it is very difficult to make a satisfactory coupling between the diode and an optical fiber, and that the emitted lights are low in quantity. Therefore, it is difficult to put the diode into practical use. In FIG. 2, reference numerals 4, 5 and 6 indicate a p-type region, an n-type region and an $SiO_2$ layer respectively.

The invention of the Japanese Patent Publication No. 28869/70 in which the different-wavelength light emissions are generated from the plural p-type regions formed on the n-type GaP substrate by the diffusion of different kinds of impurities, is different from the present invention in that different kinds of impurities are employed to obtain the different-wavelength light emissions.

The invention of the Japanese Patent Application Laid-Open No. 99991/76 in which an array of rectangular electrodes arranged on the same wafer are used and the respective regions are separated from each other by means of mesa etching techniques, is different from the present invention in that the diode has a mesa structure and the light emissions must be derived from a side face of the diode.

SUMMARY OF THE INVENTION

An object of the present invention is to eliminate the above problems, to provide a pleochroic light emitting diode which can be coupled with an optical fiber in a satisfactory manner, allows a large amount of light emissions and is suitable as a light source for an optical multiplex communication, and further to provide a method of fabricating such a diode.

To that end, the present invention uses a mixed crystal compound semiconductor layer of a first conductivity type whose mixing ratio is continuously changed in the direction of thickness. A plurality of regions of second conductivity type are formed with different depths in the compound semiconductor layer to form a plurality of p-n junctions. A plurality of light emissions with different center wavelengths generated at the p-n junctions are derived from the surface of the compound semiconductor layer.

BRIEF DESCRIPTION OF THE DRAWINGS

FIG. 1 shows in cross section an example of the conventional pleochroic light emitting diode.

FIG. 2 is a partially cross-sectional and perspective view of another example of the conventional pleochroic light emitting diode.

FIG. 3A shows sectional and plan views of a pleochroic light emitting diode according to the present invention.

FIG. 3B graphically shows the relationship between the depth and the mixing ratio for the diode shown in FIG. 3A.

DESCRIPTION OF THE PREFERRED EMBODIMENTS

Figure 4A:
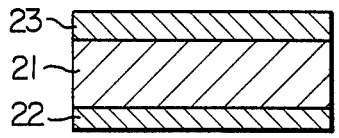
FIGS. 4A to 4E show in cross section the subsequent steps of an example of the method of fabricating the diode shown in FIG. 3A.

To explain the principle of the present invention, FIG. 3A shows sectional and plan views of an example of a light emitting diode according to the present invention which allows the incidence of three different-wavelength light emissions in a single optical fiber.

On a semiconductor substrate 11 is deposited a first conductivity type compound semiconductor layer 12 composed of a mixed crystal which has a distribution of the mixing ratio or forbidden band gap as shown in FIG. 3B. Second conductivity type diffusion regions 13, 14 and 15 are formed in the semiconductor layer 12. As seen in FIG. 3A, the diffusion depths of the regions 13, 14 and 15 from the semiconductor layer surface are different. Such regions can be formed in such a manner that impurity diffusion is made after a first film of, for example, $SiO_2$ having no masking effect in the impurity diffusion process is deposited on the surface of the semiconductor layer 12 in a form of concentric ring portions with their thicknesses stepwise different therebetween while a second film of, for example, $Si_3N_4$ having a masking effect is deposited on the semiconductor layer surface between the ring portions. By utilizing the distribution coefficient at the interface between the first film and the semiconductor layer and the difference of impurity concentration in the semiconductor layer surface developed by the difference in thickness of the first film, the above-described method enables the simultaneous formation of a plurality of junctions different in depth through a single diffusion process.

The composition of the compound semiconductor layer 12 is changed in the direction of thickness. For example, in the case where the semiconductor layer 12 is made of $Ga_{1-x}Al_xAs$, the concentration of AlAs or the mixing ratio of mixed crystal has a distribution as shown in FIG. 3B. As is well known, the wavelength of light-emission depends upon the concentration of AlAs. Therefore, if a predetermined voltage is applied between an electrode 16 provided on the substrate 11 and each of electrodes 17, 18 and 19 provided on regions 13, 14 and 15, three kinds of light emissions having different wavelengths $\lambda_3$, $\lambda_2$ and $\lambda_1$ are generated at the p-n junctions formed by the regions 13, 14 and 15 and are taken out through a silicon oxide film 20 and an optical fiber 10.

Embodiment 1

FIGS. 4A to 4E show in cross section an example of the method for fabricating the above-mentioned pleochroic light emitting diode.

The surface of a Te-doped GaAs monocrystalline substrate was mirror-like polished and then mounted in a vertical type crystal growing equipment with a uniform distribution of temperature. 20 grams of Ga, 30 milligrams of Al, 2 grams of GaAs and 5 milligrams of Te as materials for crystal growth were introduced into a crucible. $H_2$ gas was passed through a reaction furnace for about one hour to remove undesired gas. Thereafter, the temperature of the furnace was raised. At the temperature of 950° C., the GaAs substrate was placed in contact with the melt solution in the crucible. The furnace was cooled at a cooling rate of 1° C./min for about 10 minutes and then at a rate of 5° C./min.

On the GaAs substrate were thus grown a $Ga_{1-x}Al_xAs$ layer 21 (about 10 μm thick) with the concentration of AlAs varied in the direction of thickness and having an AlAs concentration of about 30% (i.e. the mixing ratio of about 0.3) at the interface with the substrate, and a GaAs layer 22 having a thickness of about 150 μm. The composition of the GaAs layer 22 corresponds to the case of x=0 in $Ga_{1-x}Al_xAs$ and has been formed at the cooling rate of 5° C./min. The $Ga_{1-x}Al_xAs$ layer 21 had the donor concentration of about $5 \times 10^{17}$ cm$^{-3}$.

The GaAs substrate was removed by polishing and the $Ga_{1-x}Al_xAs$ layer 21 was polished to a mirror finish to the thickness at which the concentration of AlAs in 28%. Thereafter, a silicon dioxide film 23 (a first film) about 4000 Å thick was formed through chemical deposition, as shown in FIG. 4A.

Figure 4B:
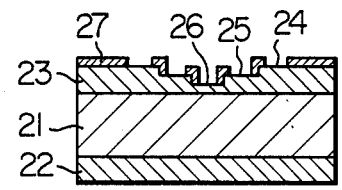

As shown in FIG. 4B, recesses 25 and 26 in a form of concentric rings having different depths were formed in the silicon dioxide film 23 through photolithographic process and chemical etching. The thickness of the silicon dioxide film was 1500 Å and 500 Å at the recesses 25 and 26 respectively. Next, those portions of the oxide film 23 where the formation of diffusion regions are not desired, were coated with an $Al_2O_3$ film 27 (a second film) formed through the chemical deposition with isopropyl aluminum and oxygen at 400° C. and patterned through photolithographic process.

Figure 4C:
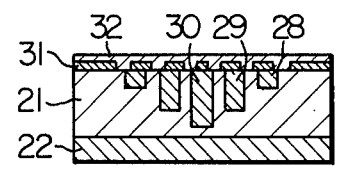

With the $Al_2O_3$ film 27 used as a diffusion mask and with $ZnAs_2$ used as a diffusion source, diffusion was carried out for five hours in a vacuum atmosphere at 850° C. As a result, diffusion regions 28, 29 and 30 about 1, 4.5 and 7 μm deep respectively as shown in FIG. 4C were formed depending upon the difference in thickness of the silicon dioxide film 23. After the $Al_2O_3$ film 27 has been removed, a silicon dioxide film 31 for forming electrodes was formed through chemical deposition and photolithographic process. Then, an AuZn film 32 about 2 μm thick was deposited over the surface through vacuum evaporation.

Figure 4D:
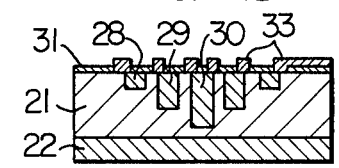
Figure 4E:
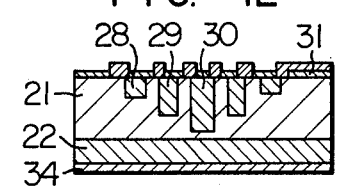

As shown in FIG. 4D, the AuZn film 32 was etched through a photolithographic process to form an electrode pattern 33. Further, an electrode 34 was formed in ohmic contact with n-type GaAs layer 22, as shown in FIG. 4E.

The thus produced diode array was scribed to separate individual diode chips. When a forward current of about 50 mA was applied between the electrode 34 and each electrode of the electrode pattern 33 for such a diode chip mounted on a stem, three kinds of light emissions having emissive powers of about 0.8, 0.9 and 1.1 mW and their center wavelengths of about 7300, 8000 and 8400 Å were generated at p-n junctions formed by the diffusion regions 28, 29 and 30 respectively.

Embodiment 2

The surface of a Te-doped GaAs monocrystalline substrate was polished to a mirror finish and then mounted in a vertical type crystal growing equipment. Ga, $AsH_3$ (arsine) and $PH_3$ (phosphine) as materials for crystal growth, $H_2$ as a carrier gas and HCl as a transport gas for Ga were used. After undesired gas within the reaction furnace was removed through gas substitution, the $H_2$ gas and the HCl gas were passed through the reaction furnace at flow rates of 1 l/min and of 5 l/min respectively. After the temperature of the furnace was raised to 800° C., the flow rates of $AsH_3$ and $PH_3$ were changed from 20 cc/min to 10 cc/min and from 1 cc/min to 10 cc/min respectively during twenty minutes to form a $GaAs_{1-x}P_x$ monocrystal having its thickness of about 10 μm and the mixing ratio x continuously changed from 0.01 to 0.35 in the direction of thickness.

In the same manner as described with respect to the embodiment 1, a plurality of diffusion regions different in depth were formed to produce light emitting diodes. When a current of 50 mA was applied to the diode, emissive powers of about 0.3, 0.5 and 0.6 mW with their center wavelengths of about 7500, 8000 and 8600 Å were respectively generated at junctions formed by regions corresponding to the above-described regions 28, 29 and 30.

Since the center wavelengths $\lambda_1$, $\lambda_2$ and $\lambda_3$ are determined depending upon the forbidden band gaps, it should be understood that desired center wavelengths can be obtained by adjusting the mixing ratio x.

As is apparent from the above-mentioned embodiments, the emission of plural lights with different center wavelengths from a single chip can be realized by preparing a compound semiconductor crystal layer whose mixing ratio x is varied in the direction of thickness and forming a plurality of diffusion regions in the semiconductor crystal layer with different depths.

Figure 5:
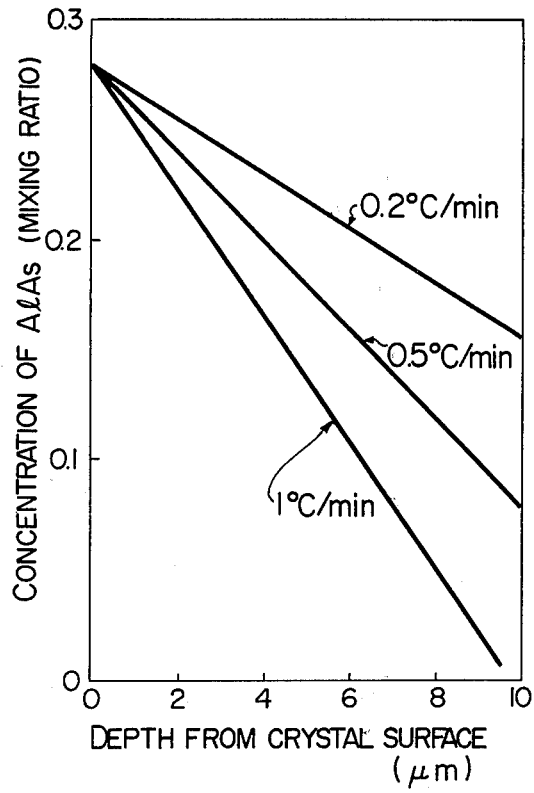
FIG. 5 graphically shows the relationship between the mixing ratio and the depth from the crystal surface with the cooling rate taken as a parameter.
Figure 6:
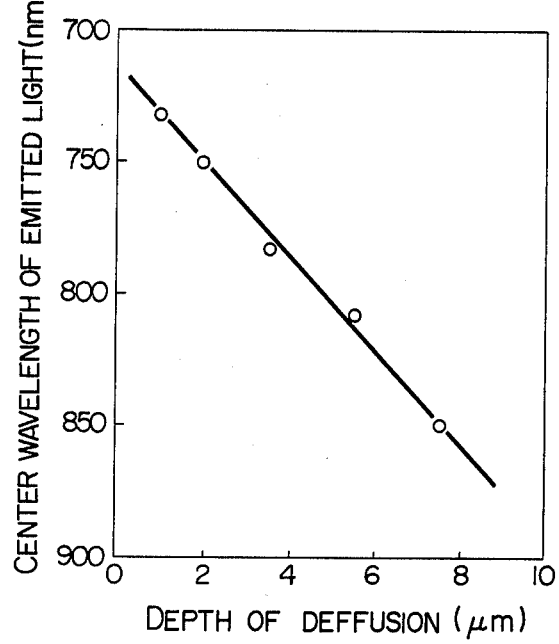
FIG. 6 graphically shows the relationship between the center wavelength of emitted light and the depth of the diffusion region.

FIG. 5 shows the gradient of the mixing ratio of a $Ga_{1-x}Al_xAs$ mixed crystal in the direction of thickness, with the cooling rate for the crystal growth taken as a parameter. As is evident from FIG. 5, the gradient of the mixing ratio in the direction of thickness is increased with the increase of the cooling rate. Therefore, a plurality of light emissions having their desired center wavelengths can be obtained by properly selecting both the cooling rate for the crystal growth and the depth of diffusion. As an example, FIG. 6 shows the relationship between the center wavelength of emitted light and the diffusion depth from the surface of a $Ga_{1-x}Al_xAs$ layer which is grown at the cooling rate of 1° C./min. As is seen from FIG. 6, the $Ga_{1-x}Al_xAs$ layer having the thickness of 10 μm obtained with the cooling rate of 1° C./min allows light emissions whose center wavelengths of can be continuously varied within a range from 730 to 850 nm in dependence upon the diffusion depth from the layer surface. Accordingly, plural light emissions having different center wavelengths can be derived from a single chip by forming a plurality of diffusion regions having different depths and the center wavelengths can be established to desired values by properly selecting the depth of each diffusion region with reference to FIG. 6.

The diffusion regions can be formed through well-known techniques such as thermal diffusion, ion implantation and the diffusion employing a doped oxide. The simultaneous formation of a plurality of diffusion regions having different depths can be made by effecting impurity diffusion after the coating of the surface of a semiconductor monocrystalline layer with a first film (of, for example, $Si_3N_4$ or $Al_2O_3$) impermeable to an impurity to be diffused (for example, an acceptor such as zinc), that is, a film having a masking effect to the impurity and a second film (of, for example, $SiO_2$ or phosphosilicate glass) having no masking effect to the impurity. In other words, the impurity diffusion is carried out after the first film of, for example, $Si_3N_4$ or $Al_2O_3$ having the masking effect to the impurity to be diffused is deposited on that surface portion of the semiconductor monocrystalline layer where the formation of diffusion regions is not desired while the second film of, for example, $SiO_2$ or phosphosilicate glass having no masking effect to the impurity is deposited on that surface portion where diffusion regions are to be formed.

Since the diffusion depth is determined by the thickness of the film having no masking effect when other conditions are not changed, the coating of the $SiO_2$ film or phosphosilicate glass film non-uniform in thickness on the surface enables the simultaneous formation of a plurality of diffusion regions different in depth through a single diffusion process. Incidentally, since the film having no masking effect is transparent to the light emitted from each diffusion region, it is not required to remove the film after the formation of the diffusion regions but the film may be used intact as a protection film.

In FIG. 3, the second conductivity-type diffusion regions have the form of a circle and of concentric rings. This form is the most preferable example for the coupling between the light emitting diode and an optical glass fiber. It should be understood that the present invention is not limited to this particular example but various forms can be used. For example, the form of the diffusion region at the center portion may take the form of square instead of circle while hollow square diffusion regions may be arranged to surround the center diffusion region. Further, a large number of square diffusion regions may be formed with an arrangement in a checkerboard.

Figure 7:
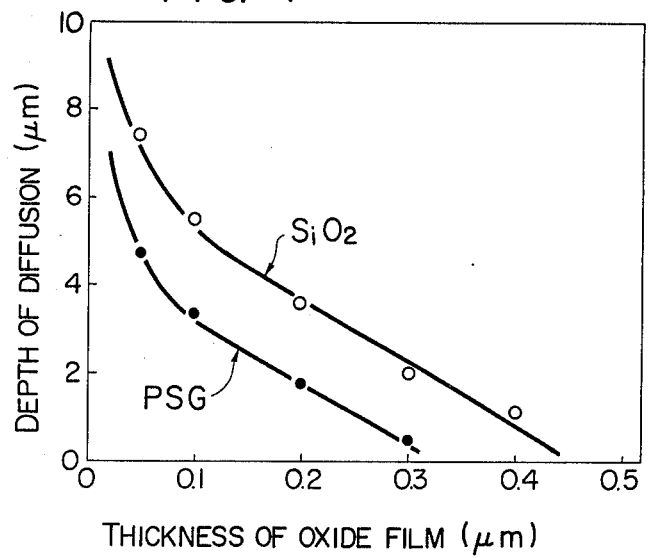
FIG. 7 graphically shows the relationship between the diffusion depth and the thickness of oxide film when an impurity is diffused through the oxide film.

FIG. 7 shows the relationship between the thickness of each of oxide films made of $SiO_2$ and phosphosilicate glass (PSG) and the diffusion depth for the case when an impurity (Zn) is diffused at 850° C. for five hours through the oxide film into a $Ga_{1-x}Al_xAs$ layer grown at the cooling rate of 1° C./min. As is seen from FIG. 7, a plurality of impurity diffusion regions having desired depths can be readily and precisely formed by selecting the kind of oxide film deposited and the thickness of the film and by diffusion the impurity through the oxide film whose thickness is changed stepwise.

It should be noted that the semiconductor material used in the present invention is not limited to $Ga_{1-x}Al_xAs$ and $GaAs_{1-x}P_x$, but InGaP, InGaAs and other mixed crystals composed of III-V Group compound semiconductors can be widely used depending upon the purpose for use.

We claim:

1. A pleochroic light emitting diode comprising:
    a mixed crystal compound semiconductor layer of a first conductivity type whose mixing ratio is continuously varied in the direction of thickness from a planar surface of said layer; and
    a plurality of regions of a second conductivity type formed in said planar surface of said compound semiconductor layer with different depths respectively relative to said planar surface to form p-n junctions with said compound semiconductor layers,
    whereby plural light emissions with different center wavelengths generated at said p-n junctions are derived from said planar surface of said compound semiconductor layer.

2. A pleochroic light emitting diode according to claim 1, wherein said first conductivity type is an n-type and said second conductivity type is a p-type.

3. A pleochroic light emitting diode according to claim 1, wherein said compound semiconductor is one selected from a group consisting of $Ga_{1-x}Al_xAs$ and $GaAs_{1-x}P_x$.

4. A pleochroic light emitting diode for generating light signals for transmission through an optical fiber comprising:

a mixed crystal compound semiconductor layer of a first conductivity type whose mixing ratio is continuously varied in the direction of thickness from a planar surface of said layer; and a plurality of regions of a second conductivity type formed in said planar surface of said compound semiconductor layer with different depths respectively relative to said planar surface to form p-n junctions with said compound semiconductor layers, whereby plural light emissions with different center wavelengths generated at said p-n junctions are derived from said planar surface of said compound semiconductor layer for coupling said plural light emissions to said optical fiber.

5. A pleochroic light emitting diode according to claim 4, wherein the light emissions are in the infrared region.

6. A pleochroic light emitting diode according to claim 4, wherein the light emissions are in a range from 7300 Å to 8600 Å.

7. A pleochroic light emitting diode according to either claim 1 or 4, further comprising first electrode means located on said planar surface of said mixed crystal compound semiconductor layer and second electrode means coupled to a substrate located along a surface of the mixed crystal compound semiconductor layer opposite to said planar surface.

* * * * *